United States Patent
Schreiber et al.

(10) Patent No.: US 10,509,752 B2
(45) Date of Patent: Dec. 17, 2019

(54) CONFIGURATION OF MULTI-DIE MODULES WITH THROUGH-SILICON VIAS

(71) Applicant: Advanced Micro Devices, Inc., Santa Clara, CA (US)

(72) Inventors: Russell Schreiber, Austin, TX (US); John Wuu, Fort Collins, CO (US); Michael K. Ciraula, Fort Collins, CO (US); Patrick J. Shyvers, Fort Collins, CO (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 15/964,647

(22) Filed: Apr. 27, 2018

(65) Prior Publication Data

US 2019/0332561 A1  Oct. 31, 2019

(51) Int. Cl.
*G11C 5/06* (2006.01)
*G06F 13/38* (2006.01)
*G06F 13/42* (2006.01)
*H01L 25/065* (2006.01)
*G06F 13/40* (2006.01)

(52) U.S. Cl.
CPC ........ *G06F 13/385* (2013.01); *G06F 13/4004* (2013.01); *G06F 13/4243* (2013.01); *H01L 25/0657* (2013.01); *H01L 2225/06517* (2013.01); *H01L 2225/06544* (2013.01)

(58) Field of Classification Search
CPC ....... H01L 25/0657; H01L 2225/06517; H01L 2225/0652; H01L 2225/06544; G06F 13/385; G06F 13/4004; G06F 13/4243
See application file for complete search history.

(56) References Cited

U.S. PATENT DOCUMENTS

| | | | |
|---|---|---|---|
| 6,154,419 A | 11/2000 | Shakkarwar | |
| 7,062,625 B1* | 6/2006 | Shrader | G11C 7/1051 711/105 |
| 9,244,872 B2 | 1/2016 | Barbiero et al. | |
| 2012/0292746 A1* | 11/2012 | Lee | H01L 21/76898 257/621 |
| 2013/0021866 A1* | 1/2013 | Lee | H01L 25/0657 365/230.01 |
| 2017/0033085 A1* | 2/2017 | Shikibu | H01L 25/0657 |
| 2018/0337160 A1* | 11/2018 | Drab | H01L 25/0657 |

* cited by examiner

*Primary Examiner* — Uyen B Tran
(74) *Attorney, Agent, or Firm* — Polansky & Associates, P.L.L.C.; Paul J. Polansky; Rosalynn M. Smith (57) ABSTRACT

A data processing system includes a processing unit that forms a base die and has a group of through-silicon vias (TSVs), and is connected to a memory system. The memory system includes a die stack that includes a first die and a second die. The first die has a first surface that includes a group of micro-bump landing pads and a group of TSV landing pads. The group of micro-bump landing pads are connected to the group of TSVs of the processing unit using a corresponding group of micro-bumps. The first die has a group of memory die TSVs. The subsequent die has a first surface that includes a group of micro-bump landing pads and a group of TSV landing pads connected to the group of TSVs of the first die. The first die communicates with the processing unit using first cycle timing, and with the subsequent die using second cycle timing.

16 Claims, 6 Drawing Sheets

CONFIGURATION OF MULTI-DIE MODULES WITH THROUGH-SILICON VIAS

CROSS REFERENCE TO RELATED, COPENDING APPLICATION

Related subject matter is found in a copending patent application entitled "FLEXIBLE INTERFACES USING THROUGH-SILICON VIA TECHNOLOGY", U.S. patent application Ser. No. 15/903,253, filed Feb. 23, 2018, invented by John Wuu, Samuel Naffziger, Michael K. Ciraula, and Russell Schreiber and assigned to the assignee hereof.

BACKGROUND

Modern integrated circuit fabrication techniques enable new ways of interconnecting integrated circuit die to achieve a small size. The small size integrated circuit dies are especially useful in small portable electronic devices such as mobile phones, personal digital assistants, and the like. One such technique is through-silicon via (TSV) technology. TSV technology is a three-dimensional packaging technology that enables vertical die stacking by utilizing metal-filled via holes. TSV stacked die reduce interconnect distances in comparison to conventional multi-stacked wire bond silicon chips, thereby enabling faster speeds and lower power consumption for a data processing system.

TSVs may be used to conduct signals from one surface of the die to the other, and enable the construction of vertical stacks of die. For example, memory dies may be vertically stacked to form a three-dimensional (3D) memory "cube" which occupies a very small volume. However, known vertically stacked die are electrically connected using micro-bumps that have a relatively large surface area on the die and add a large capacitance that limits the interconnect speed.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

As will be described below in one form, a data processing system includes a processing unit that forms a base die and has a plurality of through-silicon vias (TSVs) extending to a surface thereof, and a memory system. The memory system is coupled to the processing unit. The memory system includes a die stack. The die stack includes a first die, that has a first surface which includes a plurality of micro-bump landing pads and plurality of TSV landing pads. The plurality of micro-bump landing pads of the first die are coupled to the plurality of TSVs of the processing unit using a corresponding plurality of micro-bumps. The first die has a plurality of memory die TSVs extending through the first die to a second surface thereof. The die stack includes a subsequent die that has a first surface that includes a plurality of micro-bump landing pads and a plurality of TSV landing pads which are coupled to the plurality of TSVs of the first die. The plurality of TSV landing pads have a smaller surface area than the plurality of micro-bump landing pads of each of the first die and the subsequent die. The first die communicates with the processing unit using first cycle timing, and with the subsequent die using second cycle timing. The second cycle timing is different from the first cycle timing.

In another form, an integrated circuit die includes a plurality of micro-bump landing pads on a first surface. Additionally, the integrated circuit die includes a plurality of TSV landing pads on the first surface. The integrated circuit die also includes a plurality of TSVs that extend through to a second surface. The plurality of TSVs are arranged to connect to corresponding ones of the plurality of TSV landing pads on a first surface of a subsequent die. The integrated circuit die also has a selector circuit that selectively enables access to the plurality of micro-bump landing pads on the first surface or to the plurality of TSV landing pads on the first surface.

In still another form there is described a method for making a multi-die stack. The method for making the multi-stack die stack includes bonding a first die to a base die using a plurality of micro-bump landing pads on a first surface of the first die. The method also includes bonding a second die having a same circuit structure as the first die to the first die using a plurality of TSV landing pads on a first surface of the second die and a corresponding plurality of TSVs at a second surface of the first die. The first die is configured to couple signals conducted on the plurality of micro-bump landing pads to the corresponding plurality of TSVs. The second die is configured to couple signals conducted on a corresponding plurality of TSV landing pads on the first surface of the second die to the second surface of the second die using a corresponding plurality of TSVs.

Figure 1:
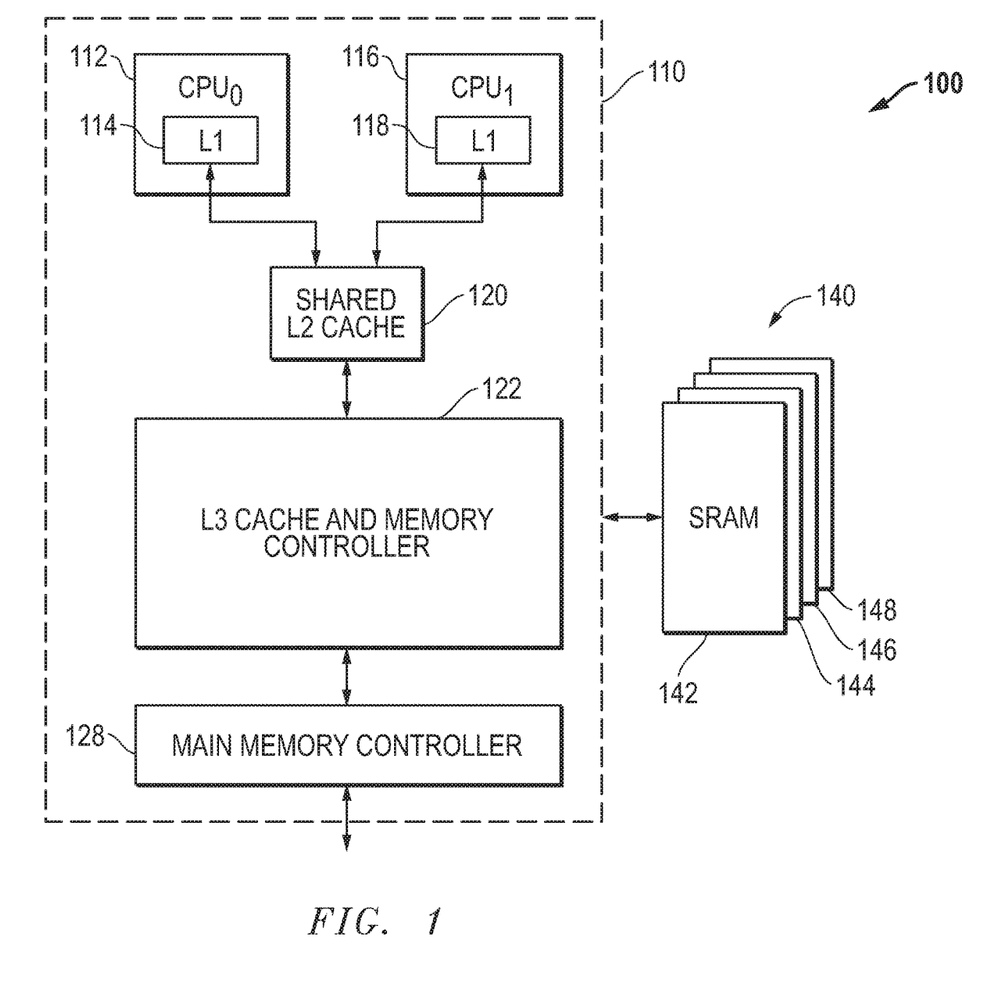
FIG. 1 illustrates in block diagram form a data processing system having a multi-chip memory system according to some embodiments.

FIG. 1 illustrates in block diagram form a data processing system 100 having a multi-chip memory system according to some embodiments. Data processing system 100 includes generally a data processor 110 and a static random-access memory ("SRAM") memory system 140. In the example shown in FIG. 1, data processor 110 is a single-chip multi-core processor that includes a first central processing unit (CPU) core 112 labeled "$CPU_0$", a second CPU core 116 labeled "$CPU_1$" a shared level-two (L2) cache 120, an L3 cache and memory controller 122, and a main memory controller 128. CPU core 112 includes a level-one (L1) cache 114 and CPU core 116 includes an L1 cache 118. SRAM memory system 140 generally includes low power, high-speed operation SRAM dies, including an SRAM die 142, an SRAM die 144, an SRAM die 146, and an SRAM die 148. Data processor 110 could be replaced with other types of data processors including accelerated processing units (APUs), digital signal processors (DSPs), single-core processors, etc.

CPU core 112 has a bidirectional port connected to a first bidirectional port of shared L2 cache 120 over a bidirectional bus. CPU core 116 has a bidirectional port connected to a second bidirectional port of shared. L2 cache 120 over a bidirectional bus. Shared L2 cache 120 has a third bidirectional port connected to a first bidirectional port of L3 cache and memory controller 122 over a bidirectional bus. L3 cache and memory controller 122 has a second bidirectional port connected to a bidirectional port of SRAM memory system 140 over a bidirectional bus and a third bidirectional port connected to a first bidirectional port of main memory controller 128 over a bidirectional bus. Main memory controller 128 has a second bidirectional port connected to main memory over a bidirectional bus.

SRAM memory system 140 is a high bandwidth memory system that provides data and tag storage for fast cache accesses of the L3 cache. In the example illustrated in FIG. 1, it includes four separate dies that can be advantageously implemented as a 3D die stack using TSVs that will now be described.

Figure 2:
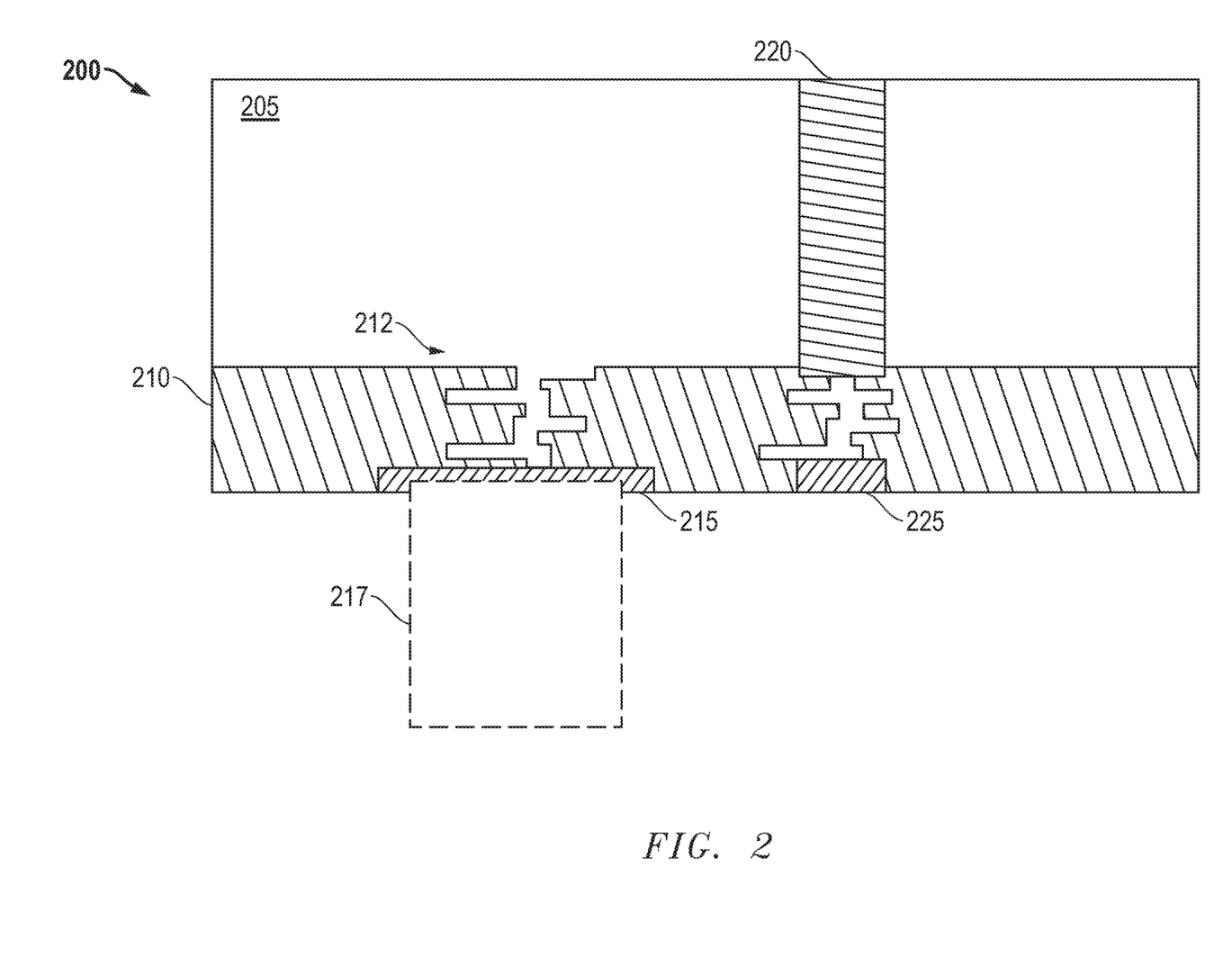
FIG. 2 illustrates a cross-sectional view of an integrated circuit die for use in the data processing system of FIG. 1 according to some embodiments.

FIG. 2 illustrates a cross-sectional view 200 of an integrated circuit die 205 for use in the data processing system of FIG. 1 according to some embodiments. Cross-sectional view 200 includes generally an integrated circuit die 205 and a micro-bump area 217.

Integrated circuit die 205 includes a back end of line (BEOL) layer 210, a gate region 212, a micro-bump landing pad 215, a through-silicon via (TSV) 220, and a TSV landing pad 225. Integrated circuit die 205 is a master memory die of a die stack, as will be described below. Gate region 212 is an area of logic gates. A group of gate regions, such as gate region 212, lie beneath the metallization layer, BEOL layer 210. TSV 220 can be selectively connected through BEOL layer 210 to TSV landing pad 225. Micro-bump landing pad 215 is a substantially planar area to which a micro-bump within micro-bump area 217 will be electrically and mechanically bonded.

Micro-bump area 217 is a location for placement of a solder bump or conductive pillar. In one embodiment, micro-bump area 217 can be filled with a solder bump that is a sphere made of metal or solder, that has a relatively low melting point, and that can reflow and bond to micro-bump landing pad 215. Micro-bump area 217 is utilized for connecting a terminal of the processing unit to micro-bump landing pad 215. A micro-bump associated with micro-bump area 217 is a larger dimensioned space than a smaller dimensioned area for bond, such as with TSV 220. Because of its larger size, micro-bump area 217 forms a higher capacitance bond, for instance, than the bond utilized for TSV 220, but micro-bump technology allows assembly to be performed by an Outsourced Assembly and Test (OSAT) facility. Interconnect structures such as micro-bumps take on a variety of forms, for example, a solder bump, conductive pillar, and/or a combination thereof. In one example, conductive pillars on each of two adjacent stacked die are thermal compression bonded. In an alternative arrangement, a direct oxide bond is made between the micro bump and micro-bump landing pad 215 by depositing an oxide film on each area. The oxide films are subsequently planarized using chemical mechanical polishing and then plasma treated to become hydrophilic. Further, the oxide films are placed together to form a bond. In another example, a hybrid bond technique is utilized. In this technique facing oxide films are formed on each of two adjacent die. The oxide film includes conductive islands of copper interspersed in the oxide film. The dies are stacked with the respective conductive interconnects aligned vertically and a heating process in excess of about 200° C. is performed to bond the conductive interconnects. Examples of interconnect materials utilized for solder bumps include tin-silver (Sn—Ag), as well as tin-silver-copper (Sn—Ag—Cu). Examples of interconnect materials utilized for conductive pillars include copper (Cu), gold (Au), aluminum (Al), or a combination thereof formed with or without solder caps.

TSV 220 is a vertical conductor passing through the substrate of integrated circuit die 205 from the active surface to the second surface of integrated circuit die 205. A group of TSVs are utilized by integrated circuit die 205 to selectively transport data and other signals to a subsequent layer of an integrated circuit die stack.

TSV landing pad 225 has a substantially planar surface, and will electrically and mechanically connect to a corresponding area on a preceding memory die. A die-to-die die bonding technology, such as hybrid bonding, is utilized for three-dimensional die stacking to distribute signals from one die to another. The die-to-die bonding technology utilized to bond to the area of TSV landing pad 225 can take on a variety of alternative forms. In the foregoing examples, other die-to-die bonding technologies can be utilized in place of the hybrid bond technology. Compatible interconnect technologies include bonds with dense pitches and low parasitic overhead, for example, thermal compression bonding and direct oxide bonding. TSV landing pad 225 is representative of a group of TSV landing pads that are formed on a first surface of integrated circuit die 205.

In operation, integrated circuit die 205 includes micro-bump landing pad 215 on a first surface, TSV landing pad 225 on the first surface, and TSV 220 that extends through the substrate to a second surface of integrated circuit die 205. Integrated circuit die 205 is configured as a master memory die; therefore, micro-bump landing pad 215 of integrated circuit die 205 is used to connect to a base die, while TSV landing pad 225 is not used. A processing unit communicates with integrated circuit die 205 (and any subsequent die in the stack) via a micro-bump connected at micro-bump area 217. Micro-bump landing pad 215 connects to a micro-bump which conducts data from the base die to integrated circuit die 205. In addition, the base die transmits data at a data rate of two bits per complete clock cycle, a method also referred to as double pumping. Utilizing a micro-bump within micro-bump area 217 to communicate data signals between the base die and integrated circuit die 205 helps to mitigate the problem of closing setup and hold timing across a stacked integrated circuit die.

Figure 3:
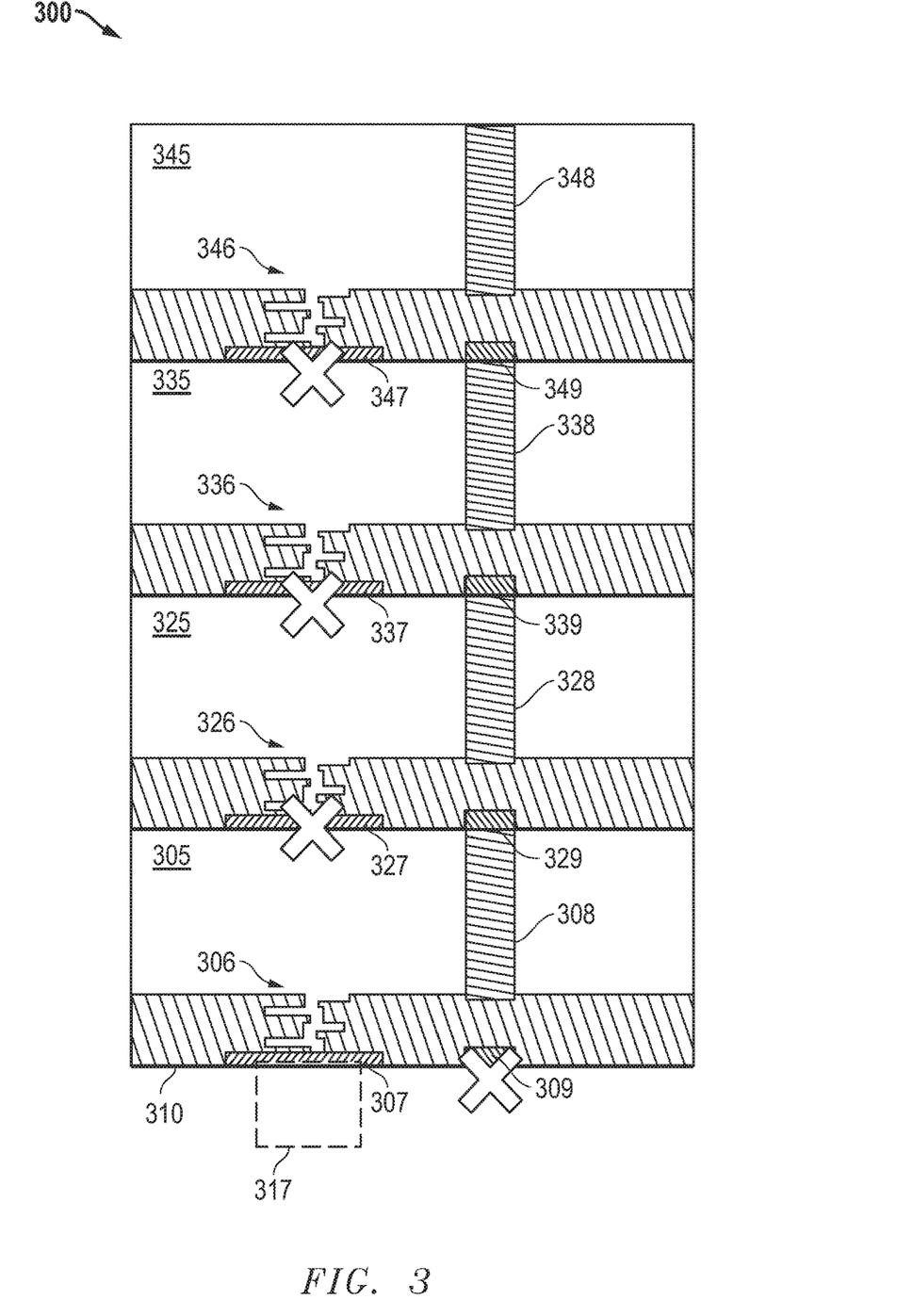
FIG. 3 illustrates a cross-sectional view of a multi-layered integrated circuit die stack suitable for use in the data processing unit of FIG. 1 according to some embodiments.

FIG. 3 illustrates a cross-sectional view of a multi-layered integrated circuit die stack suitable for use in the data processing unit of FIG. 1 according to some embodiments. Multi-layer integrated circuit die stack 300 includes generally a first integrated circuit die 305, subsequent integrated circuit dies 325, 335, and 345, and a micro-bump area 317.

First integrated circuit die 305 includes a gate region 306, a micro-bump landing pad 307, a TSV 308, a TSV landing pad 309, and a BEOL layer 310. First integrated circuit die 305 is a master memory die. A group of gate regions, such as gate region 306, form a network of circuits within first integrated circuit die 305. The metal layers in BEOL layer 310 overlie the gate regions and together they form the active surface of the die.

Subsequent integrated circuit dies 325, 335, and 345 respectively include gate regions 326, 336, and 346. Subsequent integrated circuit dies 325, 335, and 345 also respectively include TSVs 328, 338, and 348 along with TSV landing pads 329, 339, and 349. Subsequent integrated circuit dies 325, 335, and 345 are "slave" memory dies.

Similar to micro-bump landing pad 215, micro-bump landing pad 307 is a substantially planar area to which a micro-bump within micro-bump area 317 will be electrically and mechanically bonded. Micro-bump landing pad 307 is representative of a group of memory die micro-bump landing pads that are formed throughout a first surface of first integrated circuit die 305 and subsequent integrated circuit dies 325, 335, and 345. Micro-bump landing pad 307 is utilized for connecting a base die to first integrated circuit die 305.

TSVs 308, 328, 338, and 348 form vertical connections passing signals between circuitry on the active surface through their respective integrated circuit die to the other surface. A group of TSVs are utilized throughout first integrated circuit die 305 and subsequent integrated circuit die 325, 335, and 345 to transport data to each subsequent layer of multi-layer integrated circuit die stack 300.

TSV landing pads 329, 339, and 349 form substantially planar areas to which TSVs may be bonded, such as by using hybrid bonding, will be utilized to electrically and mechanically connect a subsequent memory die.

In operation, first integrated circuit die 305 includes micro-bump landing pad 307 on a first surface and TSV landing pad 309 on the first surface. TSV 308 extends through the substrate to the second surface of first integrated circuit die 305. First integrated circuit die 305 and subsequent integrated circuit dies 325, 335, and 345 include selector circuits, not shown in FIG. 3. Except for metal options that are used in some embodiments to configure them, first integrated circuit die 305 and subsequent integrated circuit dies 325, 335, and 345 have identical circuit layouts. In one embodiment, a central processing unit configures the selector circuit to function as first integrated circuit die 305 or subsequent integrated circuit die 325, 335, and 345. In another embodiment, each die can be individually configured as either a master die or a slave die through a metal option. In yet another embodiment, each die can be individually configured as either a master die or a slave die through a bonding option. The selector circuit enables a base die such as a processing unit to selectively connect to micro-bump landing pad 307 at a first interface of first integrated circuit die 305, and disables connection to TSV landing pad 309 (as shown by the superimposed symbol "X" in FIG. 3) at the first interface of first integrated circuit die 305. The selector circuit configures subsequent integrated circuit die 325 to connect to TSV 308 of first integrated circuit die 305. The connection between subsequent integrated circuit die 325 and first integrated circuit die 305 is formed via a die-to-die bond between TSV landing pad 329 and TSV 308. Further, subsequent integrated circuit die 335 connects to subsequent integrated circuit die 325 via a die-to-die bond, such as a hybrid bond with an intermediate oxide layer. The connection is formed at TSV landing pad 329 of subsequent integrated circuit die 335 and TSV 328 of subsequent integrated circuit die 325. Likewise, subsequent integrated circuit die 335 connects to subsequent integrated circuit die 345 via a die-to-die bond that is formed between TSV landing pad 349 and TSV 338.

In response to a data processing system configuring the selector circuit of first integrated circuit die 305 to be a master die, micro-bump landing pad 307 enables data to travel from the base die to first integrated circuit die 305 at a data rate of two bits per complete clock cycle in which one data bit is transmitted in synchronization with the low-to-high transition of a clock signal and the other data bit is transmitted in synchronization with the high-to-low transition of the clock signal. In response to the data processing system configuring the selector circuits of subsequent integrated circuit dies 325, 335, and 345 to be slave memory die, the data processing system disables access to micro-bump landing pads 327, 337, and 347 (as shown by the superimposed symbol "X" in FIG. 3) and enables access to TSV landing pads 329, 339, and 349 on the first surface of subsequent integrated circuit dies 325, 335, and 345. In this second configuration, the selector circuit enables connections between TSV landing pad 329 on the first surface of subsequent integrated circuit die 325 to a corresponding TSV on the second surface of first integrated circuit die 305. The connections are made enabling first integrated circuit die 305 and subsequent integrated circuit die 325 to form a die stack in a stacked formation. The connection at TSV landing pad 329 enables data to travel from first integrated circuit die 305 to subsequent integrated circuit die 325 at a data rate of one bit per complete clock cycle on a selected transition of the clock signal, such as the low-to-high transition. Further, to form a multi-layered die stack, a die-to-die bond is formed at TSV landing pad 339 on the first surface of subsequent integrated circuit die 335 and connects to a corresponding area of a TSV, TSV 328, at the second surface of subsequent integrated circuit die 325 in a stacked formation to form a multi-layered die stack, again having a rate of data transmission of one bit per complete clock cycle. Another subsequent integrated circuit die, such as subsequent integrated circuit die 345 can be added to extend the layers of multi-layer integrated circuit die stack 300, connecting at the corresponding bond on the first surface of the next stacked die.

By allowing data to travel between the base die and first integrated circuit die 305 at two bits per clock cycle, and allowing data to travel between first integrated circuit die 305 and subsequent integrated circuit die 325 at one bit per clock cycle using two data bits helps meet setup and hold timing requirements. Specifically, allowing data to travel at two bits per clock cycle at only the first layer leverages the short path distance between the base die and the first die so that setup and hold times to each clock edge can be readily met even with the higher capacitance of the micro-bumps. Allowing data to travel at one bit per clock cycle at each subsequent layer rather than two bits per clock cycle throughout all other layers of multi-layer integrated circuit die stack 300 doubles the available setup and hold times so that the additional and different path delays between the base die and subsequent memory die due to the greater distance are tolerable.

An additional advantage presented by the configuration of multi-layer integrated circuit die stack 300 is first integrated circuit die 305 and subsequent integrated circuit dies 325, 335, and 345 have identical integrated circuit design layouts that can be configured and used to form a fully functional, multi-layer memory die stack for three-dimensional memory systems. The ability to configure a common die as either a master die or a slave die immensely reduces the steps and cost of manufacturing three-dimensional memory systems. For example, a semiconductor wafer fabrication facility can manufacture and package the three-dimensional memory die stack utilizing multiple integrated circuit dies from a single die design. As a result, the cost of mask design and manufacturing is reduced. Further, the memory die stack can be fabricated and assembled at the wafer manufacturing facility, thereby reducing the cost of additional processing steps, packaging, and shipping. An Outsourced Semiconductor Assembly and Test (OSAT) facility can then provide micro-bumping assembly of die to the base die or processing unit.

Figure 4:
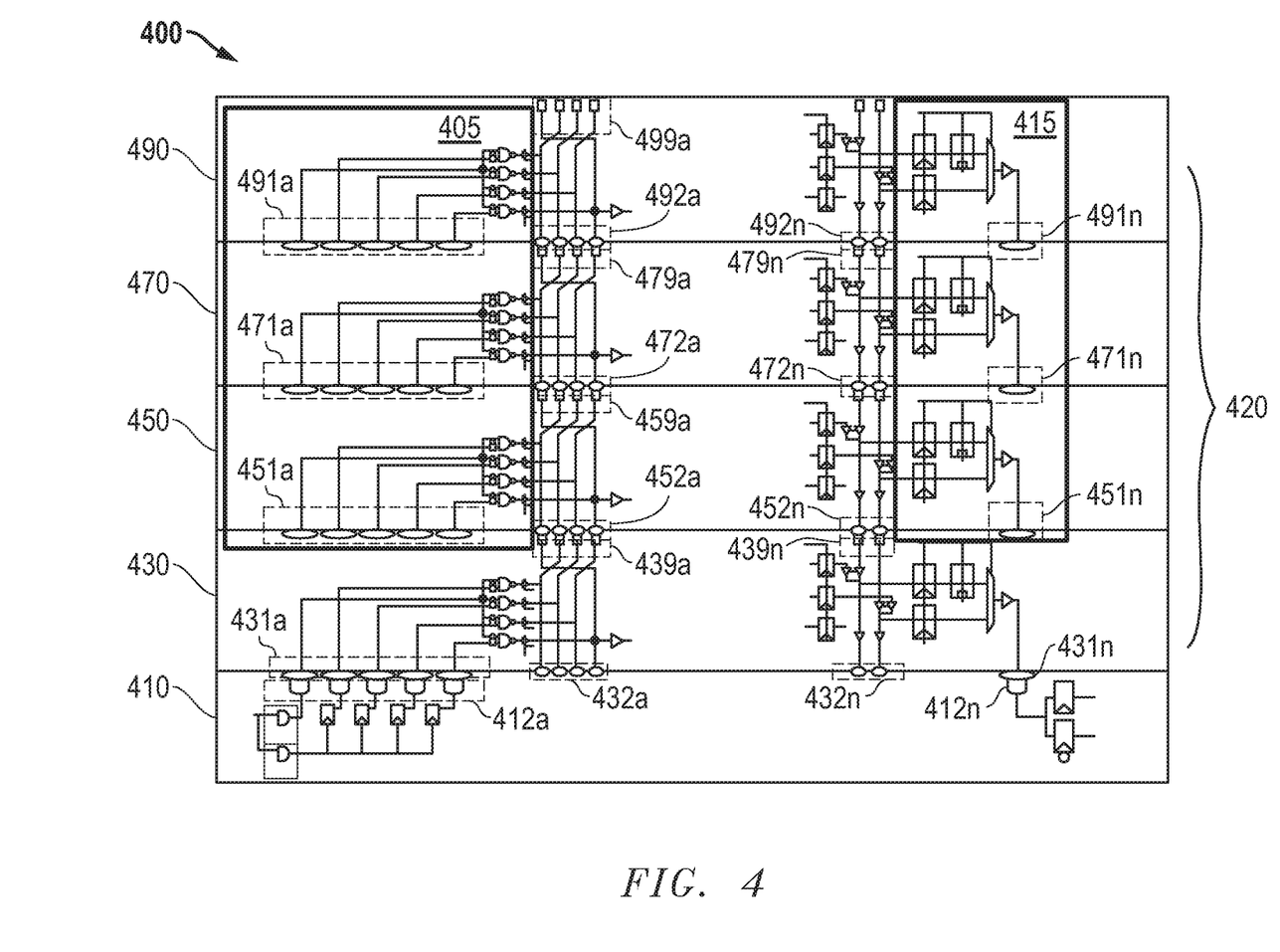
FIG. 4 illustrates in block diagram form an example integrated circuit die stack for use in the data processing system of FIG. 1 according to some embodiments.

FIG. 4 illustrates in block diagram form an example integrated circuit die stack 400 for use in the data processing system of FIG. 1 according to some embodiments. Integrated circuit die stack 400 includes a processing unit 410 and a memory system 420. Multi-layer die stack also includes disabled regions 405 and 415.

Processing unit 410 forms a base die and includes a group of base die TSVs, base die TSV 412a-n. Processing unit 410 is, for example, a CPU, a graphics processing unit, or another semiconductor with the need for high data rate and lots of memory.

Memory system 420 connects to processing unit 410. Memory system 420 includes a die stack, first die 430, and subsequent die 450, 470, and 490. Memory system 420 connects to processing unit 410 via first die 430.

First die 430 is a master memory control die, and includes a group of micro-bump landing pads 431a-n, a group of exposed TSVs s 439a-n, and a group of TSV landing pads 432a-n. Group of exposed TSVs 439a-n of first die 430 connects to subsequent die 450 via a die-to-die bond respectively forming a connection to a corresponding group of TSV landing pads 452a-n.

Subsequent die 450, 470, and 490 each include a group of micro-bump landing pads, a group of bonding pads, and a group of exposed TSVs. More specifically, subsequent die 450 includes a group of micro-bump landing pads 451a-n and a group of TSV landing pads 452a-n at a first surface, and a group of exposed TSVs 459a-n at a second surface. Subsequent die 470 includes a group of micro-bump landing pads 471a-n and a group of TSV landing pads 472a-n at a first surface, and a group of exposed TSVs 479a-n at a second surface. Further, subsequent die 490 includes a group of micro-bump landing pads 491a-n and a group of TSV landing pads 492a-n at a first surface, and a group of exposed TSVs 499a-n at a second surface.

In operation, first die 430 communicates with processing unit 410 using first cycle timing, and communicates with subsequent dies 450, 470, and 490 using second cycle timing. The second cycle timing is different from the first cycle timing. In the illustrated embodiment, the first cycle timing is a data rate of two bits per complete clock cycle. Further the second cycle timing is a data rate of one bit per complete clock cycle but using twice as many data signals so that the effective data rate is the same. Signals conducting through group of base die TSVs 412a-n are logically and electrically isolated from signals conducting through subsequent die 450, 470, and 490. In one embodiment, the die-to-die bonds connecting to exposed TSVs 439a-n, 459a-n, 479a-n, and 499a-n are hybrid bonds and are respectively connected to group of TSV landing pads 452a-n, 472a-n, and 492a-n. Disabled regions 405 and 415 and TSV landing pads 432a-n depict regions of integrated circuit die stack 400 that have been electrically isolated to strategically traverse data signals through integrated circuit die stack 400 at a predetermined rate for each layer.

First die 430 and each of subsequent dies 450, 470, and 490 generally have the same circuitry, except that if the die is configured as either the first die or a subsequent die using a metal option, it will have different metal connections that are formed or not to enable or disable certain circuitry as appropriate. In this case, a master memory die and slave memory die have the same circuits but connect the circuits differently according to the metal option. For example, disabled region 405 routes clock signals from micro-bump landing pads to a clock routing path in which the clock signals flow upward, whereas disabled region 415 routes data signals flowing downward to micro-bump landing pads using synchronizers and single pumped to double-pumped multiplexers. Metal options disable the circuitry in disabled regions 405 and 415 in subsequent dies 450, 470, and 490 while keeping the corresponding circuitry operational in first die 430.

Figure 5:
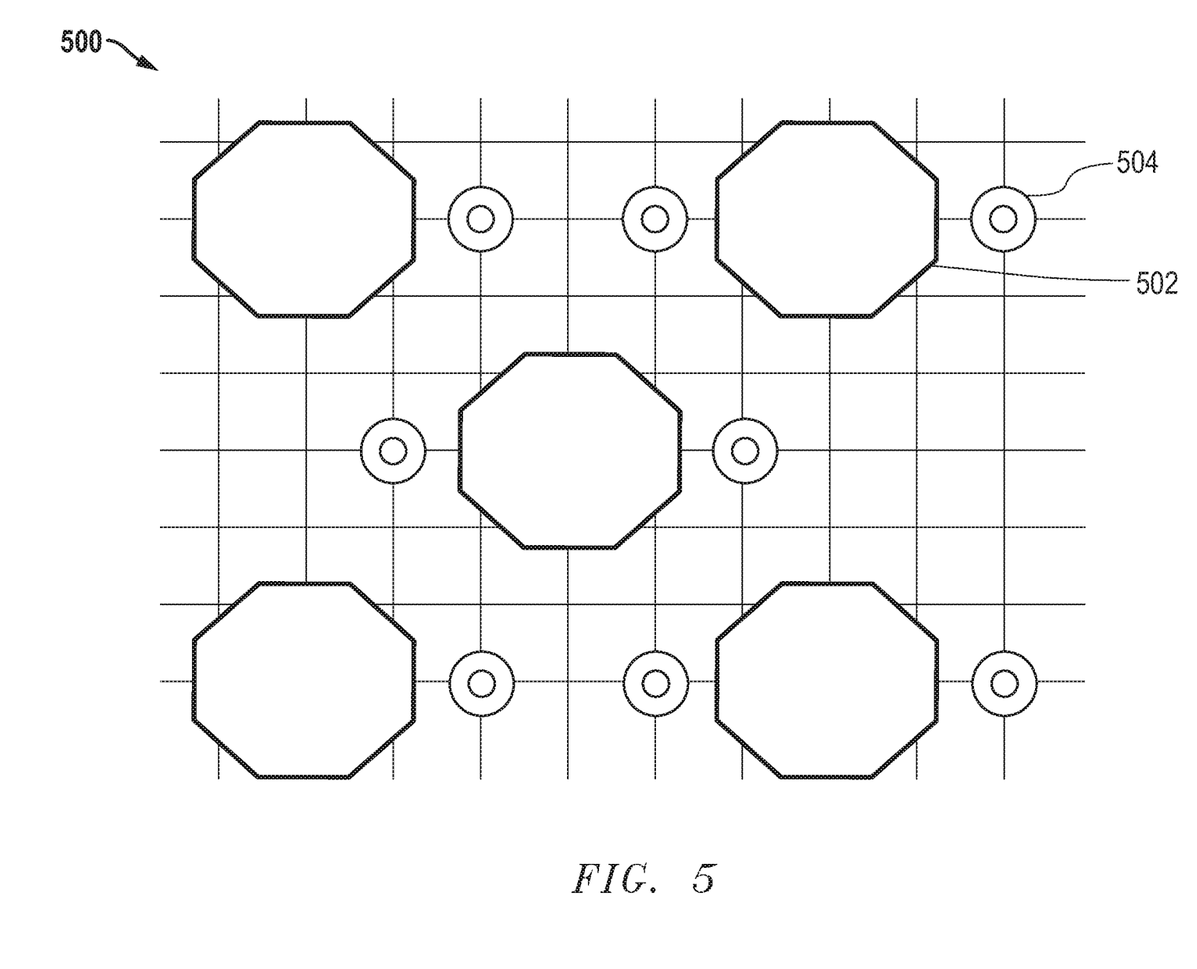
FIG. 5 illustrates a top view of a surface of a TSV layout that may be used in the integrated circuit die stack of FIG. 4 in some embodiments.

FIG. 5 illustrates a top view of a surface of a TSV layout 500 that may be used in the integrated circuit die stack of FIG. 4 in some embodiments. TSV layout 500 includes micro-bump landing pad 502 and TSV landing pad 504. Micro-bump landing pad 502 is substantially larger than TSV landing pad 504, consequently a larger number of TSV landing pads are situated between each micro-bump landing pad 502. The smaller size of TSV landing pad 504 allows a higher density of signals that use hybrid bond landing pads than signals conducted on micro-bump landing pads.

Figure 6:
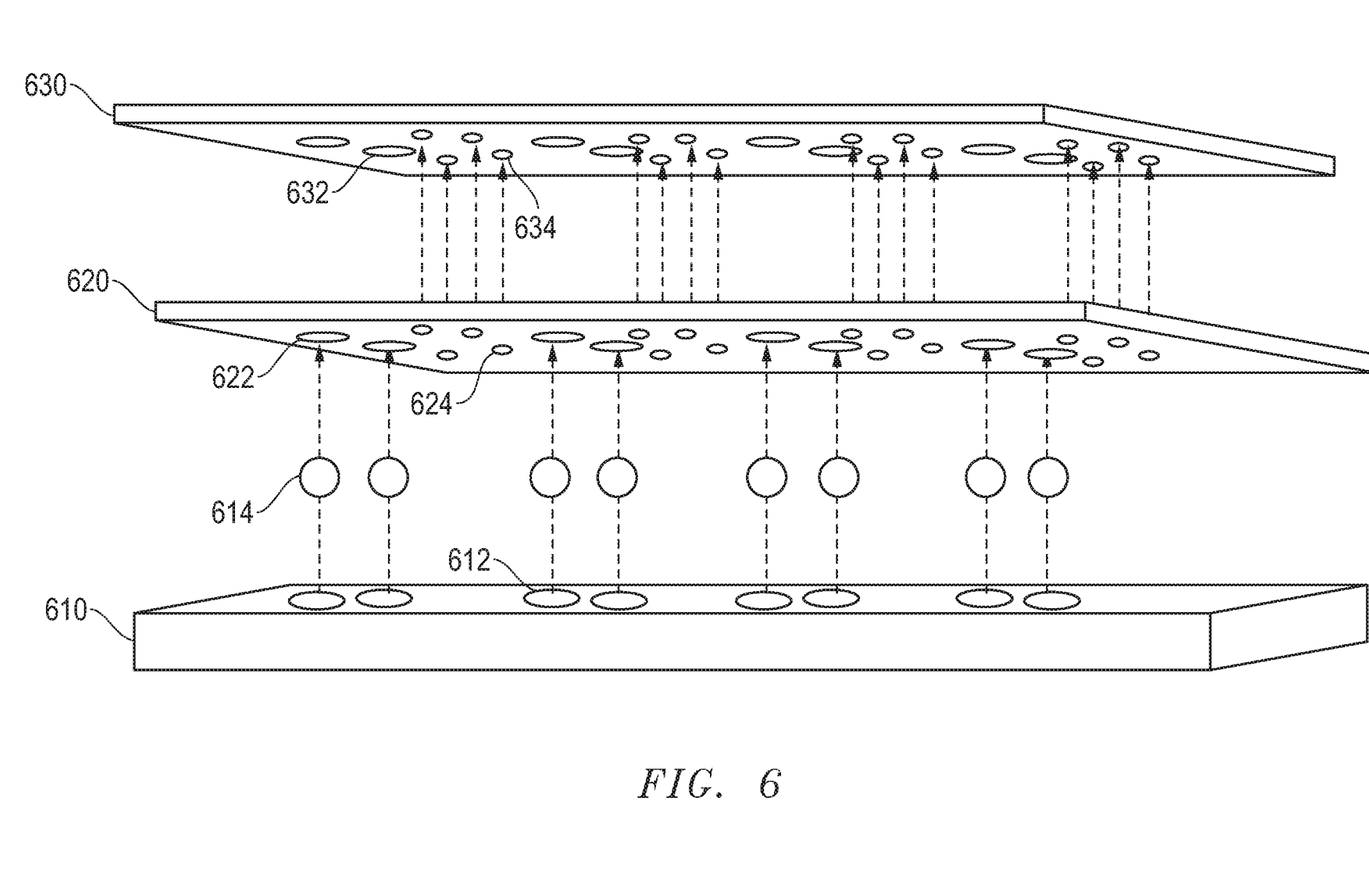
FIG. 6 illustrates a perspective view of a portion of an integrated circuit die stack for use in the example integrated circuit die stack of FIG. 4 according to some embodiments.

FIG. 6 illustrates a perspective view of a portion of an integrated circuit die stack 600 for use in the example integrated circuit die stack of FIG. 4 according to some embodiments. Integrated die stack 600 includes a base die 610, a micro-bump ball of solder, a first die 620, and a subsequent die 630.

Base die 610 includes, on a first surface, a group of base die TSVs 612. First die 620 includes, on a first surface, a group of micro-bump landing pads 622, and a group of TSV landing pads 624. On a second surface, first die 620 includes a corresponding group of TSVs, not visible in FIG. 6. Subsequent die 630 includes, on a first surface, a group of micro-bump landing pads 632, and a group of TSV landing pads 634. On a second surface, subsequent die 630 includes a corresponding group of TSVs, not visible in FIG. 6. Group of TSV landing pads 624 is a finer pitch than group of micro-bump landing pads 622, with group of TSV landing pads 624 having a pitch that is less than half the pitch of group of micro-bump landing pads 622.

In one embodiment, a method of making multi-die stack 600 includes bonding first die 620, with the first surface facing down, to base die 610, which has a first surface for bonding to first die 620. During bonding each die is arranged in a "face-down" position in the three-dimensional stack in which the active surface is oriented downward. The first surface of base die 610 connects to the first surface of first die 620 using micro-bump ball of solder 614, or a comparable interconnect technology, to connect group of base die TSVs 612 to group of micro-bump landing pads 622. A second surface of first die 620 is bonded to a first surface of subsequent die 630 via hybrid bonds, or a comparable interconnect technology, connected between group of TSV landing pads 634 and the corresponding group of TSVs. First die 620 has a same circuit structure as subsequent die 630. First die 620 is configured to connect signals conducted on group of micro-bump landing pads 622 to the second surface using the corresponding group of TSVs. Subsequent die 630 is configured to connect signals conducted on group of TSV landing pads 634 on the first surface to subsequent die (not illustrated).

Some or all of the methods illustrated in FIGS. 1-6 may be governed by instructions that are stored in a computer readable storage medium and that are executed by at least one processor. Each of the operations shown in FIGS. 1-6 may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

While particular embodiments have been described, various modifications to these embodiments will be apparent to those skilled in the art. Data processing system 100 may interface to other types of memory besides SRAM memory system 140, such as other types of high bandwidth memory (HBM), types of dynamic random-access memory (DRAM), and the like. Although described in the context of SRAM-based memory, other memory systems, for instance, die-stacked DRAMs, and NVRAMs may also be utilized.

The common integrated circuit die that may be configured as either master die or a slave die in a die stack may be described or represented at least in part by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool that may synthesize the description to produce a netlist comprising a list of gates from a synthesis library. The netlist comprises a set of gates that also represent the functionality of the common integrated circuit die. The netlist may then be placed and routed to produce a data set describing geometric shapes to be applied to masks. The masks may then be used in various semiconductor fabrication steps to produce the common integrated circuit die. Alternatively, the database on the computer accessible storage medium may be the netlist (with or without the synthesis library) or the data set, as desired, or Graphic Data System (GDS) II data.

Although the present invention has been described with reference to preferred embodiments, workers skilled in the art will recognize that changes may be made in form and detail without departing from the scope of the invention.

What is claimed is:

1. A data processing system comprising:
   a processing unit forming a base die and having a plurality of through-silicon vias (TSVs) extending to a surface thereof; and
   a memory system coupled to the processing unit, wherein the memory system includes a die stack, wherein the die stack includes:
      a first die, having a first surface including a plurality of micro-bump landing pads and plurality of TSV landing pads, wherein the plurality of micro-bump landing pads are coupled to the plurality of TSVs of the processing unit using a corresponding plurality of micro-bumps, and having a plurality of memory die TSVs extending through the first die to a second surface thereof;
      a subsequent die, having a first surface including a plurality of micro-bump landing pads and a plurality of TSV landing pads coupled to the plurality of TSVs of the first die; and
      wherein each of the plurality of TSV landing pads has a smaller surface area than each of the plurality of micro-bump landing pads of each of the first die and the subsequent die, the first die communicating with the processing unit using first cycle timing, and with the subsequent die using second cycle timing, wherein the second cycle timing is different from the first cycle timing.

2. The data processing system of claim 1, wherein first cycle timing comprises a data rate of two bits per complete clock cycle.

3. The data processing system of claim 1, wherein second cycle timing comprises at a data rate of one bit per complete clock cycle.

4. The data processing system of claim 1, wherein signals conducting through plurality of micro-bump landing pads are logically and electrically isolated from signals conducting through the plurality of TSV landing pads.

5. The data processing system of claim 1, wherein the plurality of TSV landing pads connect to a corresponding plurality of memory die TSVs using one of a hybrid bond and direct oxide bond.

6. The data processing system of claim 1, wherein the first die and the subsequent die have a circuit set that is an identical circuit set.

7. The data processing system of claim 6, wherein the data processing system configures the circuit set to operate as one of the first die and the subsequent die.

8. The data processing system of claim 7, wherein data processing system:
   disables access to the plurality of TSV landing pads at the first surface to configure the first die;
   enables access to the plurality of micro-bump landing pads at the first surface to configure the first die;
   disables access to the plurality of micro-bump landing pads on the first surface to configure the subsequent die; and
   enables access to the plurality of TSV landing pads on the first surface to configure the subsequent die.

9. An integrated circuit die capable of use in a die stack comprising:
   a first surface;
   a second surface;
   a plurality of micro-bump landing pads on the first surface;
   a plurality of TSV landing pads on the first surface, wherein each of the plurality of TSV landing pads on the first surface has a smaller surface area than each of the plurality of micro-bump landing pads on the first surface;
   a plurality of TSVs that extend through the integrated circuit die to the second surface, wherein the plurality of TSVs are arranged to connect to corresponding ones of a plurality of TSV landing pads on a first surface of a subsequent die of the die stack; and
   a selector circuit for selectively enabling access to the plurality of micro-bump landing pads on the first surface or to the plurality of TSV landing pads on the first surface.

10. The integrated circuit die of claim 9, wherein the integrated circuit die is capable of receiving data on each of the plurality of micro-bump landing pads on the first surface at a data rate of two bits per complete clock cycle and on each of the plurality of TSV landing pads at a rate of one bit per complete clock cycle.

11. The integrated circuit die of claim 10, the integrated circuit die is capable of transmitting data to each of the plurality of TSVs on the second surface from to a subsequent integrated circuit die of the die stack at a data rate of one bit per complete clock cycle.

12. The integrated circuit die of claim 11, wherein the selector circuit has an identical circuit layout for the first integrated circuit die and for the subsequent integrated circuit die.

13. The integrated circuit die of claim 12, wherein the selector circuit is configurable to to couple signals from one of the plurality of micro-bump landing pads and the plurality of TSV landing pads on the first surface to the plurality of TSVs.

14. A method of making a multi-die stack, comprising:
bonding a first die to a base die using a plurality of micro-bump landing pads on a first surface of the first die, the first die also having a plurality of TSV landing pads on the first surface, wherein each of the plurality of TSV landing pads on the first surface has a smaller surface area than each of the plurality of micro-bump landing pads on the first surface;
bonding a second die having a same circuit structure as the first die to the first die using a plurality of TSV landing pads on a first surface of the second die and a corresponding plurality of TSVs at a second surface of the first die, the second die also having a plurality of micro-bump landing pads on the first surface, wherein each of the plurality of TSV landing pads on the first surface has a smaller surface area than each of the plurality of micro-bump landing pads on the first surface;
configuring the first die to couple signals conducted on the plurality of micro-bump landing pads to the corresponding plurality of TSVs at the second surface of the first die; and
configuring the second die to couple signals conducted on the plurality of TSV landing pads on the first surface of the second die to a second surface of the second die using a corresponding plurality of TSVs.

15. The method of claim 14, further comprises:
conducting data from the base die to the first die using a first cycle timing, via the plurality of micro-bump landing pads, at a data rate of two bits per complete clock cycle; and
conducting data from the first die to the second die using a second cycle timing, via the plurality of TSV landing pads, at a data rate of one bit per complete clock cycle.

16. The method of claim 14, further comprises configuring a circuit set to operate as one of the first die and the second die.

* * * * *